United States Patent [19]
Elliott

[11] Patent Number: 4,883,962
[45] Date of Patent: Nov. 28, 1989

[54] THERMAL IMAGING DEVICES

[75] Inventor: Charles T. Elliott, Malvern, England

[73] Assignee: The Secretary of State for Defence in Her Britannic Majesty's Government of the United Kingdom of Great Britain and Northern Ireland, London, England

[21] Appl. No.: 276,202

[22] Filed: Jun. 23, 1981

Related U.S. Application Data

[63] Continuation-in-part of Ser. No. 178,556, Jul. 29, 1980.

[30] Foreign Application Priority Data

Jul. 30, 1979 [GB] United Kingdom ............... 7926455
Jul. 11, 1980 [GB] United Kingdom ............... 8022750

[51] Int. Cl.$^4$ .......................... G01T 1/22; G02B 26/10
[52] U.S. Cl. ............................. 250/334; 250/370.10; 250/370.13; 250/370.08
[58] Field of Search ............... 250/330, 332, 334, 370, 250/211 J, 370.10, 370.13, 370.08

[56] References Cited

U.S. PATENT DOCUMENTS

| | | | |
|---|---|---|---|
| 3,317,733 | 5/1967 | Horton et al. | 250/211 J |
| 3,324,297 | 6/1967 | Stieltjes et al. | 250/211 J |
| 3,391,282 | 7/1968 | Kabell | 250/211 J |
| 3,704,376 | 11/1972 | Lehovec | 250/211 J |
| 3,961,998 | 6/1976 | Scharnhorst et al. | 250/211 J |
| 3,983,573 | 9/1976 | Ishihara | 357/30 |
| 3,995,159 | 11/1976 | Elliott | 250/370 |
| 4,032,903 | 6/1977 | Weimer | 357/24 |
| 4,035,197 | 7/1977 | Raychaudhuri | 250/211 J |
| 4,238,674 | 12/1980 | Kuerbitz | 250/334 |
| 4,258,254 | 5/1981 | Elliott | |

Primary Examiner—Stephen C. Buczinski
Attorney, Agent, or Firm—Cushman, Darby & Cushman

[57] ABSTRACT

A thermal imaging system including a biassed elongate detector element of photoconductive material, over which an image of a thermal scene is scanned at a velocity that is matched to the drift velocity of photocarriers generated in the element. In order to improve responsivity and detectivity the length of the detector element or the magnitudes of bias and scan velocity are selected so that the time taken to scan the detector element from one end to a read-out region of the detector element is greater than the lifetime of the photocarriers generated in the element. In order to avoid loss of resolution by photocarrier diffusion the photocarrier lifetime of the detector material is of relatively low value. The system may include one detector element only, or it may include several detector elements arranged in parallel. Furthermore, one or more additional read-out regions, each formed by a pair of conductors, may be included in the detector element between the bias contact at one end of the element and the read-out region already mentioned.

10 Claims, 7 Drawing Sheets

THERMAL IMAGING DEVICES

This application is a continuation-in-part of U.S. application No. 178,556 filed July 29, 1980 (Dean, Dennis and Elliott) corresponding to U.K. patent application No. 79.26455 July 30, 1979.

The present invention concerns a thermal imaging system and a method for its operation; in particular a system of the kind comprising:

an elongate detector element of photoconductive material;

a bias supply connected across the detector;

a read-out circuit responsive to the detector;

an optical assembly for focussing an image of a thermal scene on to the surface of the detector; and, a scan-mechanism for scanning the image along the length of the detector element;

wherein for appropriate bias and scan velocity, photocarriers generated in the element are caused to drift along the element at an ambipolar drift velocity that is matched to the scan velocity.

A system of this kind is described in G.B. Pat. No. 1,488,258 (U.S. Pat. No. 3,995,159), the contents of which are here imported by way of reference. As therein described the detector element is a strip of cadmium mercury telluride material having bias contacts at each end, and a read-out region provided between the bias contacts. Two forms of read-out region are described. One form, a passive read-out, comprises a pair of conductors in contact with the strip, spaced a short distance apart along the length of the strip. One of these conductors may be provided by the adjacent bias contact (the second of the two bias contacts). The associated read-out circuit includes a high impedance pre-amplifier and is connected across the two conductors. This circuit produces an output signal dependent on the voltage between the two conductors, a voltage which is modulated as the resistivity of the region between the conductors changes with variation of the local photocarrier density. The output signal provides an analogue representation of the thermal scene. The read-out region geometry (ie both the conductor spacing "a" and the strip width "w") is chosen as a compromise between signal level and spatial resolution, and depends on the extent of photocarrier diffusion ($2\lambda$):

$a \simeq 2\lambda$ and $w \simeq 2\lambda$ where $\lambda \simeq \sqrt{(Dt)}$, $t \leq \tau$ "D" being the ambipolar coefficient for carrier diffusion at the operating temperature, "t" the time taken to scan an image along the detector element from the first bias contact to the read-out region, and "$\tau$" the lifetime of the photocarriers.

The alternative form of read-out, an active read-out, comprises a p-n junction formed in the strip. The associated read-out circuit includes a discharge impedance and a pre-amplifier connected to measure the discharge current. The read-out region and its circuit serve to sweep out photocarriers; an output signal providing analogue representation of the thermal scene is thus provided. In this case the time constant "T" of the read-out circuit is chosen to optimise spatial resolution:

$vT \leq 2\lambda$, v being the drift velocity of the photocarriers.

In the system described therein the spacing between the first bias contact and the read-out region is chosen so that the maximum transit time of the photocarriers is less than the photocarrier lifetime. In fact for the example particularly described, for material exhibiting a relatively long lifetime ($\sim 10$ $\mu$s), the loss of resolution arising from photocarrier diffusion is limited by restricting this spacing to a value significantly less than the distance that would be travelled by photocarriers in a lifetime:

$l << v\tau$ in fact $l \simeq 0.5$ $v\tau$

According to the present invention the system is characterised by detector material of relatively short photocarrier lifetime, and a spacing between the first bias contact and the read-out region of the detector element such that for the appropriate bias and scan velocity, the time taken to scan the distance between the first bias contact and the read-out region is greater than the photocarrier lifetime.

This system may, for example, include a plurality of detector elements arranged parallel to each other in the focal plane of the optical assembly, and each having a bias supply and a read-out circuit.

According to another aspect of the invention, a method of operating a thermal imaging system includes selecting the bias and the appropriate scan velocity such that the distance between the bias contact at one end of the detector element and the read-out region remote therefrom, is scanned in a time greater than the photocarrier lifetime.

Quite contrary to G.B. Pat. No. 1,488,258, it is found for material exhibiting relatively short photocarrier lifetime that it is not at all necessary to limit the bias contact to read-out spacing to give a short time scan time (ie $t < \tau$). With the scan time in excess of the photocarrier lifetime as here, the diffusive spread of photocarriers remains relatively constant:

$2\lambda \simeq 2\sqrt{D\tau}$

With material exhibiting relatively short photocarrier lifetime, this extent of diffusion and the resultant limitation in spatial resolution is acceptable for imaging applications. Furthermore, it is in fact advantageous to use a scan-time greater than the photocarrier lifetime. Although photocarriers are lost by recombination, the photocarrier density does not fall. Instead, it continues to increase with continued exposure of the detector material, approaching an equilibrium level where optical generation balances recombination. Both read-out signal level and signal-over-noise are improved as a result of the added time that is afforded for signal integration in the detector element.

Further advantage may be achieved, by including one or more additional passive read-out regions between the bias contact at one end of the detector element and the read-out region at the other end. When this detector is used in the system, the scan velocity and the matching bias applied to the detector element are chosen so that the spacing between adjacent read-out regions is no shorter than the average path length of the photocarriers under operative conditions—ie the product of minority carrier average lifetime $\tau$ and the ambipolar drift velocity v. This choice then ensures that there is little if any correlation in noise between the signals produced at each of the read-out regions.

This modified director element may also be used in combination with other similar elements arranged in parallel in the focal plane of the system optics.

Embodiments of the invention will now be described, by way of example only, with reference to the accompanying drawings of which.

Figure 1:
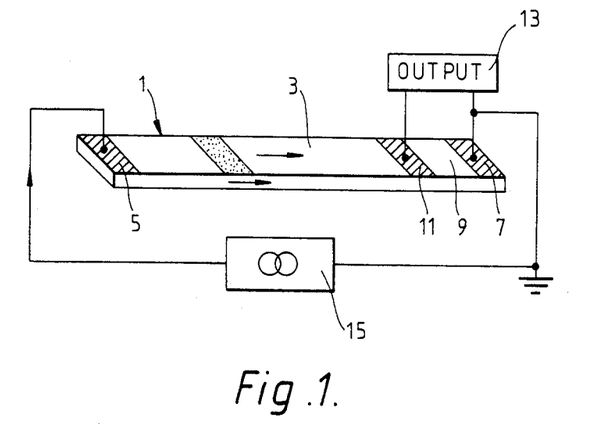
FIG. 1: is a diagram, partly in perspective form, and partly in circuit form, of a single element detector and bias supply.

There is shown in FIG. 1 a biassed detector 1 comprising a strip 3 of photoconductive material provided with ohmic end contacts 5 and 7 one at each end, and a passive read-out region 9 between these contacts 5 and 7. This read-out region is formed by one of the end contacts 7 and an additional contact 11, also ohmic, spaced from the end contact 7 by a short distance. A high impedance pre-amplifier, part of a read-out output circuit 13 is connected between the two read-out contacts 7 and 11. The detector 1 is biassed by means of a constant current supply source 15.

In detail, the strip 13 is of intrinsic n-type cadmium mercury telluride material (CMT):

$$Cd_xHg_{1-x}Te; x=0.208$$

exhibiting a net donor concentration $\bar{n}$ of approximately $5 \times 10^{14}$ cm$^{-3}$. At liquid nitrogen temperature, CMT material of this composition has a long wavelength infra-red response cut-off in the 8 to 14 μm of the spectrum at around 11.5 to 12 μm and thus will respond to radiation in this band at least up to this cut-off value. The strip 3 is 8 μm thick (d), 62 μm wide (w) and of length (l) 700 μm between the end contacts 5 and 7. The resistance of the strip is around 500 Ω. It is mounted on a sapphire substrate (not shown) and the CMT surfaces are passivated with an anodic oxide. The contacts 5, 7 and 11 are of gold metal formed by evaporation. Under operating conditions, the material exhibits a photocarrier lifetime of about 2 μs, a relatively short lifetime value. This corresponds to a diffusion length "λ" of around 5 μm. To match the diffusive spread of photocarriers, to give compromise signal level and spatial resolution, the additional contact 11 is spaced a distance 50 μm from the nearest end contact 7.

Figure 2:
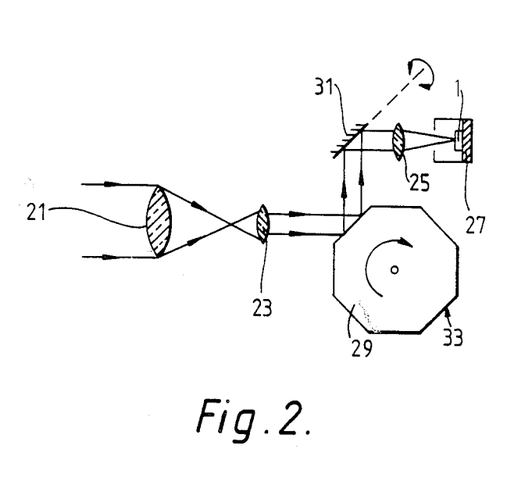
FIG. 2: is a plan schematic of a thermal imaging system showing the optical assembly and scan-mechanism in particular.

The detector is located at the focus of an optical assembly, as shown in FIG. 2. The optical assembly comprises a first pair of infra-red transmitting lenses 21 and 23 arranged to collimate and direct radiation towards a third lens 25. The detector 1 is located in the focal plane of this third lens 25 and is shielded from much of the background radiation by means of a cold shield 27, also part of the optical assembly. The detector lens 25 has an F-number (ie the ratio of focal length to diameter) of 3 and the aperture of the cold shield is matched to this lens F-number. A Joule-Thomson cooler is used to maintain the shield 27 and the detector 1 at liquid nitrogen temperature (77° K.).

It is noted that both the ambipolar mobility $\mu_a$ and the excess carrier lifetime $\tau$ depends on electron and hole densities n and p respectively:

$$\mu_a = (n-p)\mu_n\mu_p/(n\mu_n + p\mu_p)$$

and when electron-electron Auger recombination predominates $$\tau \simeq 2\tau_{Ai}\frac{n_i^2}{n(n+p)},$$

where $\tau_{Ai}$ is in the intrinsic Auger lifetime and $n_i$ is the intrinsic carrier density.

The electron and hole densities depend somewhat on the background radiation flux. Choosing a system F-number in the range 2.5 to 3 helps to limit the background flux and to achieve a sufficiently high mobility and lifetime, both factors on which optimum resolution depends. The material described, exhibits an ambipolar mobility of around 450 cm$^2$v$^{-1}$s$^{-1}$ and an excess carrier lifetime of around 2 μs for a typical background flux of $2 \times 10^{16}$ cm$^2$s$^{-1}$ (ie the infra-red spectral band up to the cut-off).

A scan mechanism is interposed between the second and third lenses 23 and 25. This comprises an octagonal drum reflector 29 and a flapping mirror 31. As the drum reflector 29 is rotated, the image of a distant thermal scene focussed onto the surface of the detector 1 is scanned along the length of the detector strip element 3. When the bias current flowing through the strip 3 is adjusted so that photocarriers are driven towards the read-out region 9 at the same velocity as the image, the output signal from the circuit 13 provides a line signal, ie a time dependent signal representative of a strip of the thermal scene. As the drum 29 rotates and each of its faces 33 intersects the beam of collimated radiation, a new line scan is initiated. The flapping mirror 31 is advanced each time so that as each line scan is initiated, a different strip of the thermal scene is imaged. The thermal scene is thus scanned line by line until a frame is completed, a new frame is then initiated, and so forth.

In the system thus far described, the bias current is adjusted to give a bias field of 29 V cm$^{-1}$ and the scan velocity chosen to match the ambipolar drift is approximately $1.3 \times 10^4$ cm s$^{-1}$. The time taken to scan the strip from the bias contact 5 at one end to the read-out region 9 is thus 700 μm $\div 1.3 \times 10^4$ cm s$^{-1} \simeq 5.4$ μs.

Thus in this example the scan time exceeds the lifetime by a factor of 2.7 or thereabouts. At this scanning rate the detector provides data at a pixel rate (ie V/w) of about 2.1 MHz. Under these operating conditions the responsivity and detectivity measured with 500° K. blackbody radiation have been found to be around $1.5 \times 10^5$ VW$^{-1}$ and $1.7 \times 10^{11}$ cm Hz$^{\frac{1}{2}}$W$^{-1}$ respectively.

Alternatively, operating the detector with a bias field of 68 V/cm and scanning at a matched velocity of $3.1 \times 10^4$ cm/s, a responsivity of $2.5 \times 10^5$ V/W$^{-1}$ and a detectivity of $2.0 \times 10^{11}$ cm H$_z^{\frac{1}{2}}$W$^{-1}$ have been measured. In this example the scan time exceeds the lifetime by a factor of 1.1 or thereabouts.

Figure 3:
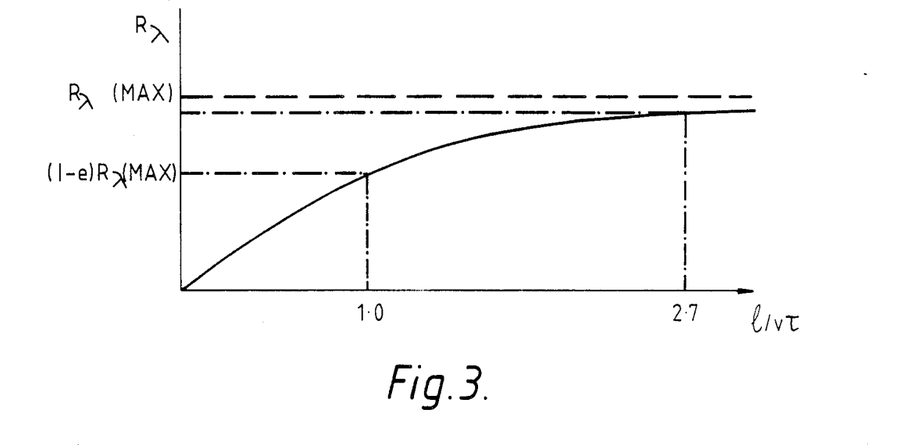
FIG. 3: is a graph showing the variation of detector responsivity as a function of detector length.

It is found that the responsivity R (defined as the voltage output produced by a radiation density of 1 watt per width squared incident on the detector) is given by the formula:

$$R = \frac{\eta \, \tau \, a \, v}{E_\lambda \, w^2 d n \mu_a} [1 - \exp(-1/v\tau)]$$

where $\eta$ is the quantum efficiency for converting infrared photons to photocarriers, for radiation in the spectral band of width E up to cut off wavelength, $\tau$ the carrier lifetime, l, w and d the dimensions of the strip; "a" the read-out spacing, $\mu_a$ the ambipolar mobility, n the net donor concentration, and v the scan velocity. A quantum efficiency of 0.6 is typical. This can be further improved by using an anti-reflection coating, for example by spattering a thin layer of zinc sulphide on to the cadmium mercury telluride surface and over the anodic coating. As can be seen from FIG. 3, the responsivity of the detector at a specified scan velocity increases with the length of detector provided. The detectivity also is improved if a detector of long length is used:

$$D^* \propto [1-\exp(-1/v)]^{\frac{1}{2}}$$

where the detectivity D* is a measure of the signal-to noise performance and in this case is defined as the signal-to-noise ratio in unit bandwidth, when a radiation density of 1 watt per width squared is incident on the detector, multiplied by the width.

Whilst better signal level (eg responsivity) and signal above noise (eg detectivity) is achieved by using long detectors, thus high l, this is accompanied by a higher power dissipation. Ultimately the choice is governed by practical bias supply and temperature control limitations, and the choice of length l would be a compromise between these competing considerations. Where relatively high power dissipation can be tolerated, a detector having a length up to 5 to 6 times the value $v\tau$ would represent a practical compromise, eg the detector described in the first example may be increased in length to say 1400 μm giving a scan time of 10.8 μs with consequent increase in R and D*.

It is noted that the passive read-out provided by contacts 11 and 7 may be replaced by an active read-out. In this case the contact 11 is replaced by a diode implanted or diffused in the strip in the vicinity of the bias contact 7. As known this may be discharged to earth through a discharge resistor and the current flowing in this discharge resistor measured by means of a high impedance pre-amplifier. The combination of this pre-amplifier and the discharge resistor replacing the output circuit 13 referred to above. As already set forth above the time constant of this circuit, which is here defined by the bandwidth of the pre-amplifier, is set to match the diffusion of the photocarriers, to optimise resolution.

Figure 4:
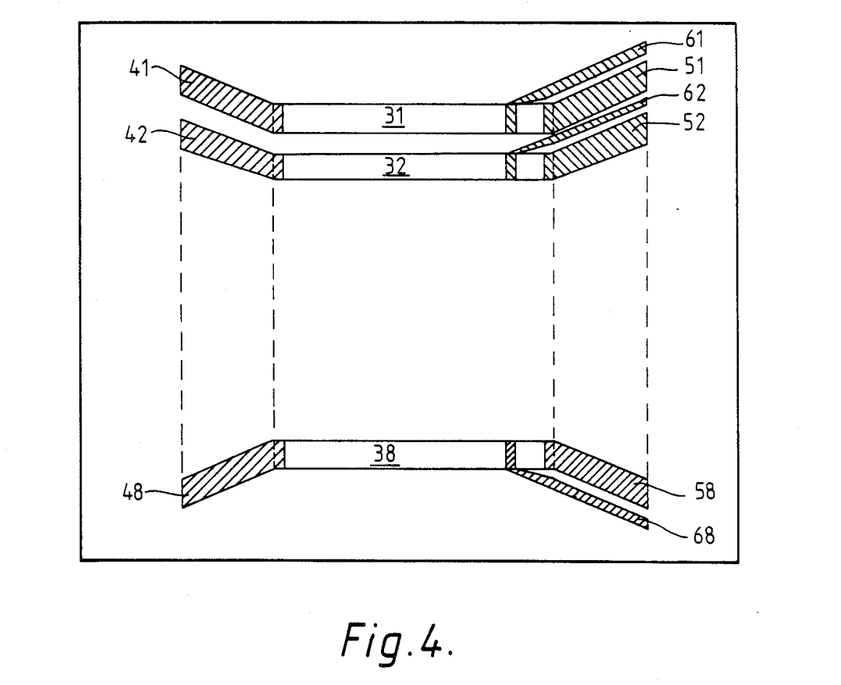
FIG. 4: is a plan view of a detector comprising several parallel elements for use in a system such as is shown in FIG. 2 above.

The detector used in the system of FIG. 2 may have parallel content. Thus the detector shown in FIG. 4 comprises an array of eight parallel elements 31 to 38. Each element has the same dimensions and is of the same material as the single element described above. This detector is positioned in the focal plane of the same lens 25 (F-number 3) of the system of FIG. 2 above. Each element 31 to 38 is mounted on a sapphire substrate and is spaced apart from the next element by a gap of 12.5 μm wide. Gold metal end contacts 41 to 48 and 51 to 58 are formed at the ends of the elements and have a fanned out configuration to facilitate lead-out bonding. Additional metal contacts 61 to 68 are also provided at one end to provide read-out. These contacts 61 to 68 and the adjacent end contacts 51 to 58 are connected in pairs 61 and 51, to 68 and 58 each across the high imput impedance of a corresponding pre-amplifier (not shown). For this parallel array the frame scan flapping mirror 31 is advanced so that the thermal scene is scanned band by band, eight lines at a time, until a frame of information is derived. The line signals may then subsequently be processed to provide a video signal for TV display.

The systems described above may be improved further by modifying the or each detector element, including one or more additional and passive read-out regions intermediate the bias contact or contacts at one end of the detector and the read-out region or regions at the other end of the detector.

Figure 5:
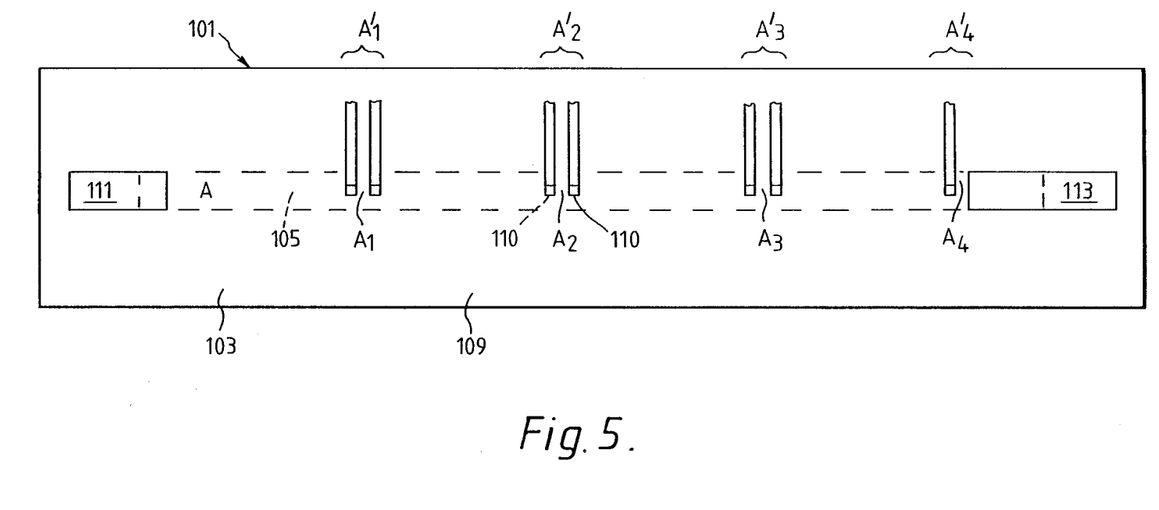
FIG. 5: is a plan drawing of a modified thermal imaging device.

Thus as shown in FIG. 5 a thermal imaging device 101 is provided by an aluminium oxide (sapphire) substrate 103 bearing a strip detector A, comprising a strip 105 of a cadmium mercury telluride (CMT) photoconductive material—eg Cd$_{0.2}$Hg$_{0.8}$Te, the material described above. Input and output bias contacts 111, 113 are provided by sputtering nichrome-gold, these contacts being formed at the end of the CMT strip 105. An anti-reflection coating 109 is deposited on the upper exposed surfaces of the device—for example, a thin layer of zinc sulphide material is sputtered on to these surfaces and patterned in conventional manner to leave window regions 110 of the CMT strip exposed to facilitate contact metallisation. Passive read-out regions A$_1$, . . ., A$_4$ are defined by paired electrical contacts A$_1'$, . . ., A$_4'$ also of nichrome-gold material. These read-out regions lie between the bias contacts 111, 113 of the strip and are uniformly spaced. The electrical contacts A$_1'$, . . . , A$_4'$ each have a pair separation of about 50 to 60 microns and each pair is uniformly spaced from its neighbour by about 400 micron. The strip 105 is approximately 63 microns wide.

This device 101 is installed in the imaging system and is located at the focal plane of the detector lens 25 of the optical assembly shown in FIG. 2.

Each of the pair contacts A$_1'$ to A$_4'$ are followed by external amplifiers and the signals for the strip detector added with appropriate time delay to compensate for the finite time of scan of the image from one detection region to the next. When the image has been scanned along the device, the line selection mirror 31 is advanced, and as the line scan reflector 29 continues rotation, the image is caused to fly back and the next adjacent line of the thermal image is scanned. This process is repeated so that the scene is imaged line by line until the whole scene is covered. It is noted here that the scan velocity and the matched bias that is applied to the detector element, are both chosen so that the spacing between the input bias contact 111 and the first read-out region $A_1$, and the spacing between adjacent read-out regions $A_1$ and $A_2$, $A_2$ and $A_3$, and $A_3$ and $A_4$, are no shorter than the average path length of the photocarriers under operative conditions—ie the product of minority carrier average lifetime $\tau$ and the ambipolar drift velocity v of the photocarriers. This choice of scan velocity and bias ensures that there is little or no correlation in noise between the signals provided at each read-out region. These signals are amplified and time-delayed and then added. The random noise tends to cancel in the resultant sum signal and the signal-over-noise is improved.

Figure 6:
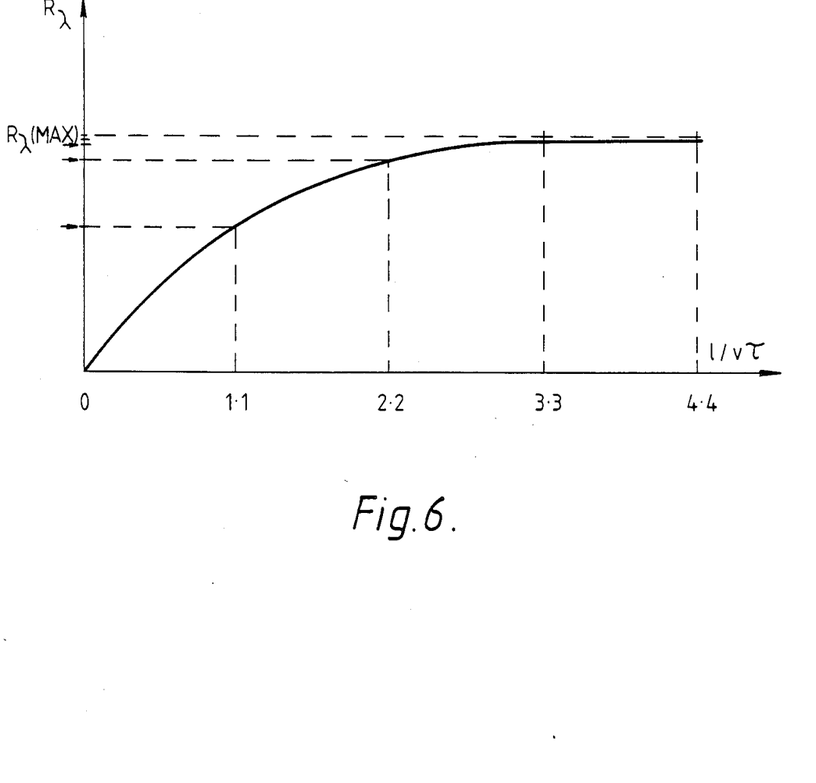
FIG. 6: is a graph showing the variation of detector responsivity as a function of detector length for the detector of FIG. 5 above.

The responsivity of the detector A is illustrated in FIG. 6. As can be seen from this graph, each read-out contributes a significant signal, and the further the read-out region is from the input contact 111, the larger is the contribution. With a read-out to read-out spacing of 400 microns, a photocarrier lifetime of around 2 $\mu$s and a scan velocity of approximately 18.1 meters per second, the read-out to read-out spacing is about 10% larger than the distance covered by the photocarriers in a lifetime. Spacings of 1.1, 2.2, 3.3 and 4.4 v are illustrated.

An alternative imaging device for use in this system is shown in FIGS. 7 to 10 inclusive. In this device 101', 8 strip detectors A to H are mounted on a composite insulating substrate 3. It is convenient to produce these from an over size slice of CMT material. This may be done by bonding an over size slice of CMT material on to an insulating substrate with an epoxy resin adhesive, defining the strip pattern photolithographically using a photo-resist medium and cutting the slice in this pattern using an ion beam milling technique. When the structure is produced in this manner the strips A to H may be formed in accurate parallelism and with minimal spacing between each strip. The close spacing of the strips make optimum the proportion of the device area that is available for radiation detection. With this technique a detector element to element spacing of about 12 microns can be achieved. Thus in FIG. 7 each element A to H is 63 microns wide and the pitch of the device is therefore about 75 microns. Each strip detector is provided with an input bias concept 111 and an output bias contact 113 of nichrome-gold material formed at either end. Between these contacts are four read-out regions $A_1$ to $A_4$, ..., $H_1$ to $H_4$ spaced at uniform intervals along each strip of CMT material 105. The detector strips A to H are indented at each read-out region $A_1$, ..., $H_4$ to allow space for contact connection to the underlying substrate 103. The composite substrate 103 comprises a base layer 103B of semiconductor material having on its upper surface a thin layer of insulator material 103A. The semiconductor material may be of intrinsic p-type silicaon having a typical majority carrier density of about $5 \times 10^{14}$ per cubic centimeter, and the layer of insulator material may be silicon oxide, grown by conventional controlled oxidation of the underlying silicon material 103B.

A patterned arrangement of conductive tracks 121 is formed in the semiconductor base 103B. Each track is formed by diffusion or ion-implantation of an n-type dopant material eg phosphorus. The doping process is controlled to give an excess n-type carrier concentration of about $1 \times 10^5$ per cu cm. Each conductive track 121 is isolated from adjacent tracks by means of a channel stop network 123. This network may be formed in similar manner to the tracks, a p-type dopant material—eg boron—being used. The channel stop network 123 has a p-type carrier concentration of about $1 \times 10^{19}$ per cu cm. An insulating oxide layer 103A is formed over the whole of this surface.

In the vicinity of the indented detection output regions $A_1$, ..., $H_4$ insulator material 103A is removed to expose window areas 124 of the conductive tracks 121 formed in the base layer 103B. Bridging links of metallic material 125—eg nichrome gold are formed to define and connect the read-out regions to the tracks 121, each link being connected to a different one of the conductive tracks 121. The links 125 are paired and thus provide voltage detection contacts. Insulator material is also removed to expose window areas 172 of the underlying tracks 121 and to allow further connection of these tracks to output connection pads 129. To minimise signal noise, each conductive track is dimensioned to have approximately the same resistance between windows 124 and 127. The longest tracks 121, that extend to the innermost detectors D and E, are therefore also the widest.

Figure 7:
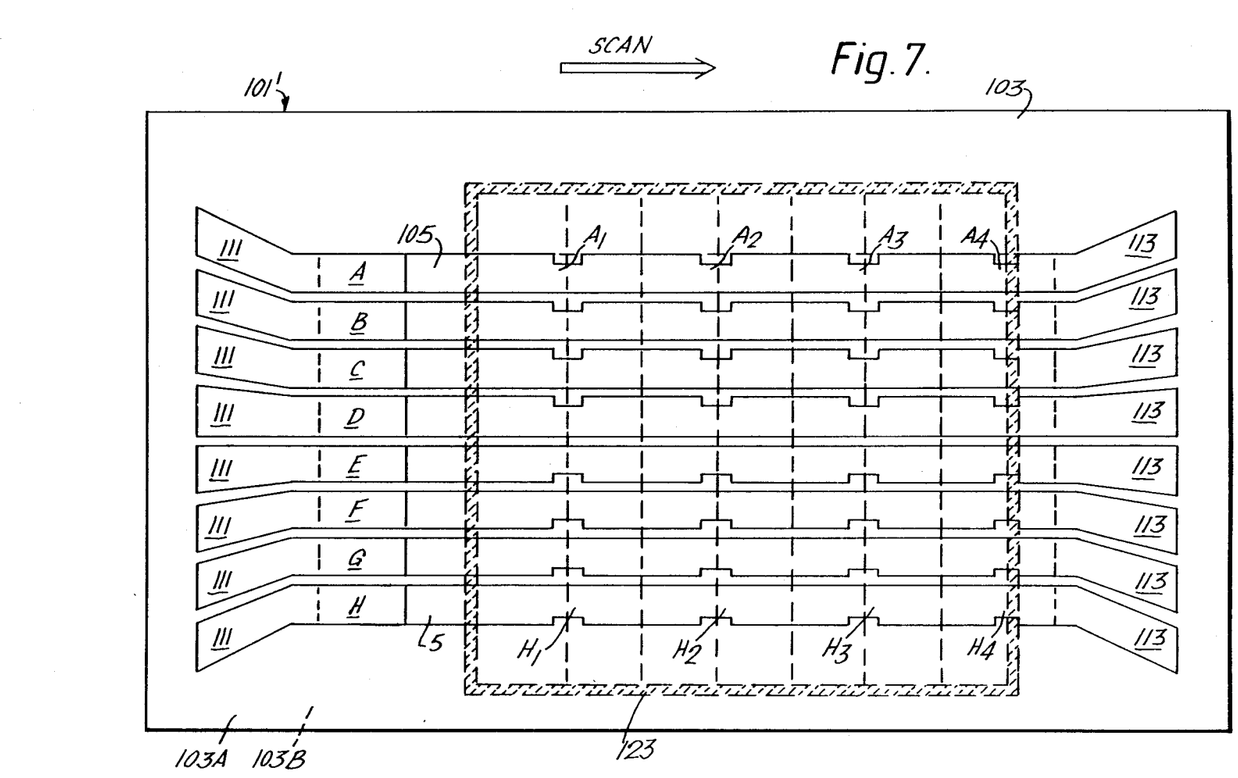
FIG. 7: is a plan drawing of an alternative thermal imaging device (details of connection configuration being omitted for clarity)

It will be understood that amplifier and time-delay-and-integration components may be encorporated in the semiconductor base layer 103B around the periphery of the strips 105 and connection to these components made directly from the tracks 121. Alternatively, in place of the tracks 121, connection may be made directly from the read-out regions $A_1$ $H_4$ to semiconductor components encorporated in the base layer 103B, these components being arranged in the area underlaying the strips 105.

Figure 8:
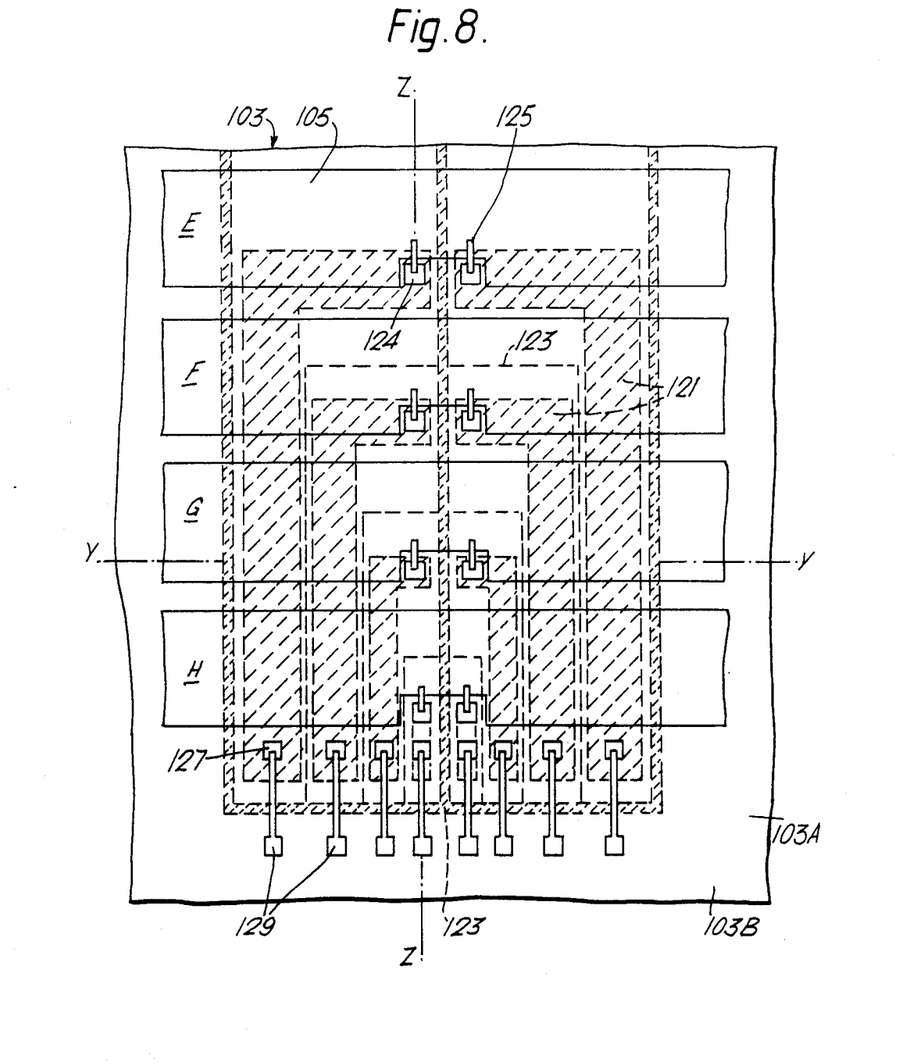
FIG. 8: is an enlarged plan of a portion of the device shown in FIG. 7, showing detail of the connection configuration; and, FIGS. 9 and 10: are cross-sections of portions of the device shown in FIGS. 7 and 8 taken along the lines y—y and z—z of FIG. 8 respectively.
Figure 9:
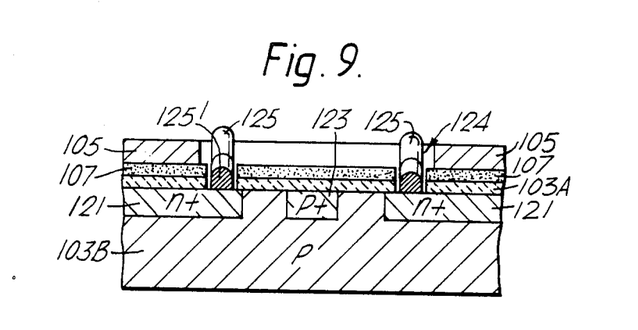
Figure 10:
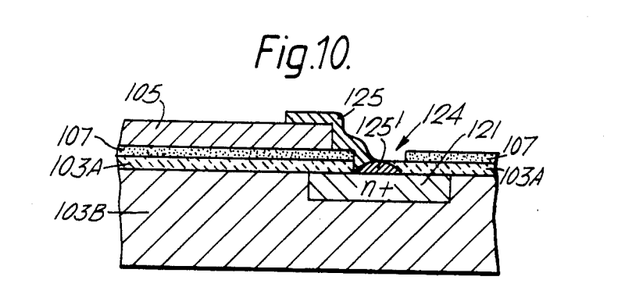

For better production yield, the contact connections between the detectors 105 and the conductive tracks 121 may be formed in the following manner. Starting with the silicon substrate $103_B$ with oxidised surface $103_A$ and preformed conductive tracks 121, a layer of negative photo-resist is spun on to the surface and window regions defined by exposure and removal of part of the resist. The substrate is then etched to remove windows in the silicon oxide surface layer $103_A$, and the remaining resist removed. Aluminium is evaporated on to the exposed surfaces. A layer of negative photo-resist is then spun on to the surface of the aluminium and a pattern of masking areas of resist formed photo-lithographically over the surface. These mask areas are in register with the original window areas but are smaller in size. The aluminium is then etched leaving aluminium contact pads 125' below the remaining resist, and the resist removed. Since the mask areas are smaller than the original windows, any raised areas of aluminium around the edges of the windows are also etched away. The aluminium contact pads are then lightly etched back until they each lie with their free surface co-planar with or below the planar surface of the oxide layer $103_A$. The substrate is then fired at 450° C. to 500° C. to ensure that good electrical contact is made between each aluminium contact pad and the underlying conductive track. A layer of CMT is then bonded on to the substrate surface and the detector geometry defined as described above. Bridging links 125 are then completed by sputtering nichrome gold to provide contact between regions on the detector strips and the preformed aluminium contact pads 125', these pads being exposed during geometry definition.

The technique just described may also be used to provide connection between the read-out regions and any circuitry embodied in the underlying substrate.

Having particularly described the invention and the manner by which it may be performed, I claim:

1. A thermal imaging system of the kind comprising:
A photoconductive detector including:
   at least one elongate detector element;
   an input bias contact to each element;
   an output bias contact to each element spaced from the corresponding input bias contact; and,
   a read-out region for each element, located between the input bias contact and the output bias contact;
biassing means connected across the detector;
at least one read-out circuit, one connected to each read-out region;
an optical assembly for focussing an image of a thermal scene on to the surface of the detector; and,
a scan mechanism for scanning the image along the length of each detector element;
wherein for appropriate scan velocity and bias, photocarriers generated in each element are caused to drift along each element towards the read-out region at an ambipolar drift velocity that is matched to the scan velocity;
wherein the improvement is characterised by detector material of relatively short photocarrier lifetime; and a spacing between each input bias contact and the corresponding read-out region of each detector element such that for the appropriate scan velocity and bias, the time taken to scan the distance between each input bias contact and the corresponding read-out region is greater than the photocarrier lifetime.

2. A system as claimed in claim 1 wherein the time taken to scan the distance between each input bias contact and the corresponding read-out region is greater than the photocarrier lifetime by a factor between 1 and 3 inclusive.

3. A system as claimed in claim 1 wherein the time taken to scan the distance between each input bias contact and the corresponding read-out region is greater than the photocarrier lifetime by a factor between 3 and 6 inclusive.

4. A system as claimed in claim 1 wherein each detector element is of Cadmium Mercury Telluride material and is sensitive to infra-red radiation in the 8 to 14 micron band of the spectrum.

5. A thermal imaging system comprising:
A photoconductive detector including:
   at least one elongate detector element of photoconductive material;
   an input bias contact to each element;
   an output bias contact to each element, separated from the input bias contact;
   a plurality of passive read-out regions for each element, located between the input bias contact and the output bias contact;
biassing means connected across the detector;
a plurality of read-out circuits for each element, one connected to each read-out region of the element;
delay and summation means for each element, connected to each read-out circuit of the element, to provide for each element a summed output signal;
an optical assembly for focussing an image of a thermal scene on to the surface of the detector; and,
a scan mechanism for scanning the image along the length of each detector element;
wherein for appropriate scan velocity and bias, photocarriers generated in each element are caused to drift along each element towards the read-out regions at an ambipolar drift velocity that is matched to the scan velocity;
wherein the detector material has the property of relatively short photocarrier lifetime, and the spacing between each input bias contact and the nearest corresponding read-out region of the detector element, and the spacing between each corresponding read-out region and the next read-out region is such that for the appropriate scan velocity and bias, the time taken to scan each spacing is greater than the photocarrier lifetime.

6. A system as claimed in claim 5, the detector comprising:
an insulating substrate;
at least one elongate detector element of photoconductive material having the property of relatively short photocarrier lifetime, mounted on the insulating substrate;
an input bias contact to each element;
an output bias contact to each element, spaced from the input bias contact;
a plurality of passive read-out regions for each element, spaced apart along the length of the element between the input bias contact and the output bias contact.

7. A method of operating a thermal imaging system of the kind including an elongate detector element of relatively short photocarrier lifetime photoconductive material having an input bias contact and an output bias contact and a read-out region between the input bias contact and the output bias contact, the method including the following steps:
scanning an image of a thermal scene over the surface of the detector element;
applying a bias to the detector element such that the drift velocity of photocarriers generated in the element is matched to the scan velocity, and such that for the scan velocity as this bias the distance between the input bias contact and the read-out region is scanned in a time greater than the photocarrier lifetime.

8. A method as claimed in claim 7 wherein the time is greater than the photocarrier lifetime by a factor between 1 and 3 inclusive.

9. A method as claimed in claim 7 wherein the time is greater than the photocarrier lifetime by a factor between 3 and 6 inclusive.

10. A system as claimed in claim 5, the detector comprising:
an insulating substrate; and,
at least one photoconductive element mounted on this insulating substrate, this element comprising essentially an elongate strip of photoconductive material having the property of relatively short photocarrier lifetime, with an input bias contact, and, spaced from this, an output bias contact, it being possible for bias current to flow through the strip from one contact to the other; Elliott et al, Ser. No. 276,202 wherein the element includes, upon its surface, a plurality of paired contacts, each pair being spaced apart from the next adjacent pair, along the length of the element between the input bias contact and the output bias contact, each pair to serve the purpose of passively sensing photocarriers in an ambipolar drift thereof between the bias contacts.

* * * * *